US009859136B2

(12) United States Patent
Namba et al.

(10) Patent No.: US 9,859,136 B2
(45) Date of Patent: *Jan. 2, 2018

(54) SUBSTRATE PROCESSING APPARATUS AND SUBSTRATE PROCESSING METHOD (71) Applicant: Tokyo Electron Limited, Tokyo (JP)

(72) Inventors: Hiromitsu Namba, Kumamoto (JP); . Fitrianto, Kumamoto (JP); Yoichi Tokunaga, Kumamoto (JP); Yoshifumi Amano, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 227 days.

This patent is subject to a terminal disclaimer.

(21) Appl. No.: 14/447,029

(22) Filed: Jul. 30, 2014

(65) Prior Publication Data

US 2014/0374022 A1   Dec. 25, 2014

Related U.S. Application Data (63) Continuation of application No. 13/727,671, filed on Dec. 27, 2012, now Pat. No. 8,828,183.

(30) Foreign Application Priority Data

Dec. 28, 2011 (JP) ................................. 2011-289320
Nov. 5, 2012 (JP) ................................. 2012-243723

(51) Int. Cl.
*H01L 21/67* (2006.01)
*H01L 21/683* (2006.01)
(Continued)

(52) U.S. Cl.
CPC .... *H01L 21/6708* (2013.01); *H01L 21/02087* (2013.01); *H01L 21/30604* (2013.01);
(Continued)

(58) Field of Classification Search
None
See application file for complete search history.

(56) References Cited

U.S. PATENT DOCUMENTS 6,793,769 B2   9/2004  Kajino et al.
7,722,736 B2 *  5/2010  Miya ..................... B08B 3/04
                                                134/119
(Continued)

FOREIGN PATENT DOCUMENTS

JP   06-124887 A   5/1994
JP   2008-153452 A   7/2008
(Continued)

*Primary Examiner* — Sylvia R MacArthur
(74) *Attorney, Agent, or Firm* — Abelman, Frayne & Schwab (57) ABSTRACT

A substrate processing apparatus includes a substrate holding unit configured to hold a substrate; a first processing liquid nozzle configured to supply a first processing liquid to a peripheral portion of the substrate; a second processing liquid nozzle configured to supply a second processing liquid, the temperature of which is lower than that of the first processing liquid, to the peripheral portion of the substrate; a first gas supply port configured to supply a first gas at a first temperature to a first gas supplied place on the peripheral portion of the substrate; and a second gas supply port configured to supply a second gas at a second temperature lower than the first temperature to a place closer to the center in the radial direction as compared to the first gas supplied place with respect to the substrate.

10 Claims, 7 Drawing Sheets

(51) Int. Cl.
   *H01L 21/306* (2006.01)
   *H01L 21/02* (2006.01)
   *H01L 21/3213* (2006.01)

(52) U.S. Cl.
   CPC .. *H01L 21/32134* (2013.01); *H01L 21/67109* (2013.01); *H01L 21/6838* (2013.01)

(56) References Cited

U.S. PATENT DOCUMENTS

| | | | |
|---|---|---|---|
| 7,935,217 B2 | 5/2011 | Yashiki et al. | |
| 8,828,183 B2* | 9/2014 | Namba | H01L 21/32134 118/730 |
| 2008/0093340 A1* | 4/2008 | Nakamori | H01L 21/02019 216/57 |
| 2008/0142054 A1* | 6/2008 | Eitoku | H01L 21/6708 134/30 |
| 2009/0202951 A1* | 8/2009 | Yamamoto | G03F 7/168 430/322 |
| 2011/0048468 A1* | 3/2011 | Amano | H01L 21/67051 134/32 |
| 2011/0282484 A1* | 11/2011 | Amano | H01L 21/67046 700/114 |
| 2011/0308554 A1* | 12/2011 | Namba | H01L 21/6708 134/26 |
| 2014/0374022 A1* | 12/2014 | Namba | H01L 21/02087 156/345.15 |
| 2015/0318192 A1* | 11/2015 | Ito | H01L 21/67109 438/748 |

FOREIGN PATENT DOCUMENTS

| | | |
|---|---|---|
| JP | 2011-054932 A | 3/2011 |
| KR | 10-2010-0075948 A | 7/2010 |
| WO | 2009-147962 A | 12/2009 |

* cited by examiner

SUBSTRATE PROCESSING APPARATUS AND SUBSTRATE PROCESSING METHOD

CROSS-REFERENCE TO RELATED APPLICATIONS

This application is a continuation of U.S. patent application Ser. No. 13/727,671, filed on Dec. 27, 2012, which claims priority from Japanese Patent Application Nos. 2011-289320 and 2012-243723, filed on Dec. 28, 2011 and Nov. 5, 2012, respectively, all of which are incorporated herein in their entireties by reference.

TECHNICAL FIELD

The present invention relates to a substrate processing apparatus and a substrate processing method for processing a peripheral portion of a substrate by using a processing liquid.

BACKGROUND

A series of processings for manufacturing of semiconductor devices include a processing to remove an unnecessary film from a peripheral portion (a portion in the vicinity of outer periphery from which a semiconductor device product may not be obtained) of a semiconductor wafer (hereinafter, simply referred to as a "wafer"). As a method for removing an unnecessary film, a wet etching method is commonly used, in which a chemical liquid is supplied to a peripheral portion in a state where a wafer is rotated in a horizontal posture. When an unnecessary film is removed by a wet etching, an etching liquid of a relatively high temperature (for example, SC-1 liquid of about 60° C.) is used in some cases. In that event, there is a problem in that if the wafer gets cold, the etching liquid is then cooled, which makes it difficult to obtain a sufficient reaction rate. In order to solve this problem, Japanese Patent Application Laid-Open No. 2011-54932 discloses a configuration in which, when a wet etching is performed on a peripheral portion of a wafer, hot gas is sprayed onto at least the peripheral portion of the wafer to increase the temperature of the peripheral portion.

When a periphery removal processing is performed on a wafer having a plurality of films laminated thereon, the wafer temperature for etching each film should be changed in some cases. For example, when an upper layer is processed at a high temperature using a first etching liquid, then a lower layer should be processed at a low temperature using a second etching liquid. In the apparatus as described in Japanese Patent Application Laid-Open No. 2011-54932, it is difficult to rapidly decrease the temperature of the wafer after increasing the temperature, and there is room for improvement in that point.

SUMMARY

The present disclosure provides a substrate processing apparatus including a substrate holding unit configured to hold a substrate horizontally; a rotation driving unit configured to rotate the substrate holding unit; a first processing liquid nozzle configured to supply a first processing liquid to a peripheral portion of the substrate held by the substrate holding unit; a second processing liquid nozzle configured to supply a second processing liquid, the temperature of which is lower than that of the first processing liquid, to the peripheral portion of the substrate held by the substrate holding unit; a first gas supply port configured to supply a first gas at a first temperature to a first gas supplied place on the peripheral portion of the substrate held by the substrate holding unit; and a second gas supply port configured to supply a second gas at a second temperature lower than the first temperature to a place closer to the center in the radial direction as compared to the first gas supplied place with respect to the substrate held by the substrate holding unit.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawing, and claims are not meant to be limiting. Other embodiments may be utilized, and other changes may be made, without departing from the spirit or scope of the subject matter presented here.

The present disclosure provides a technique capable of rapidly increasing the temperature of a substrate when processing a peripheral portion of the substrate with a processing liquid.

The present disclosure provides a substrate processing apparatus including: a substrate holding unit configured to hold a substrate horizontally; a rotation driving unit configured to rotate the substrate holding unit; a first processing liquid nozzle configured to supply a first processing liquid to a peripheral portion of the substrate held by the substrate holding unit; a second processing liquid nozzle configured to supply a second processing liquid, the temperature of which is lower than that of the first processing liquid, to the peripheral portion of the substrate held by the substrate holding unit; a first gas supply port configured to supply a first gas at a first temperature to a first gas supplied place on the peripheral portion of the substrate held by the substrate holding unit; and a second gas supply port configured to supply a second gas at a second temperature lower than the first temperature to a place closer to the center in the radial direction as compared to the first gas supplied place with respect to the substrate held by the substrate holding unit.

The above-described substrate processing apparatus further includes: a cover plate having a bottom surface opposite to an upper surface of the substrate held by the substrate holding unit, and configured to cover the substrate from the upper side of the substrate, wherein the second gas supply port is provided in the cover plate at a location opposite to the central portion of the substrate held by the substrate holding unit.

In the above-described substrate processing apparatus, the first gas supply port is provided with a heater to heat the first gas in the cover plate. Further, the first gas supply port supplies the first gas from an opening formed in the cover plate to the substrate.

The above-described substrate processing apparatus further includes a cover member configured to cover the peripheral portion of the upper surface of the substrate held by the substrate holding unit, and the second gas supply port supplies the second gas to a central portion of the substrate in a radially inner side as compared to the peripheral portion, and exposed without being covered by the cover member.

In the above-described substrate processing apparatus, the first gas supply port and the second gas supply port supply the first gas and the second gas from the lower side of the substrate held by the substrate holding unit to the bottom surface of the substrate.

In the above-described substrate processing apparatus, the second gas supply port has a switching unit configured to switch supplying and supply-stopping of the second gas.

In the above-described substrate processing apparatus, the first gas supply port has a switching unit configured to switch supplying and supply-stopping of the first gas, and the second gas supply port has a switching unit configured to switch supplying and supply-stopping of the second gas.

In the above-described substrate processing apparatus, the second gas supply port is connected to a pressurized gas source, and the first gas ejection port of the first gas supply port is provided along the circumference of the cover member.

Further, the present disclosure provides a substrate processing method using a substrate processing apparatus including: a substrate holding unit configured to hold a substrate horizontally; a rotation driving unit configured to rotate the substrate holding unit; a first processing liquid nozzle configured to supply a first processing liquid to a peripheral portion of the substrate held by the substrate holding unit; a second processing liquid nozzle configured to supply a second processing liquid, the temperature of which is lower than that of the first processing liquid, to the peripheral portion of the substrate held by the substrate holding unit; a first gas supply port configured to supply a first gas at a first temperature to a first gas supplied place on the peripheral portion of the substrate held by the substrate holding unit; and a second gas supply port configured to supply a second gas at a second temperature lower than the first temperature to a place closer to the center in the radial direction as compared to the first gas supplied place with respect to the substrate held by the substrate holding unit. The substrate processing method includes: rotating the substrate using the rotation driving unit while holding the substrate horizontally with the substrate holding unit; supplying the first processing liquid to a peripheral portion of the rotating substrate using the first processing liquid nozzle while supplying the first gas at the first temperature to the peripheral portion of the substrate using the first gas supply port; and supplying the second processing liquid at the temperature lower than that of the first processing liquid to the peripheral portion of the rotating substrate using the second processing liquid nozzle while supplying the second gas at the second temperature lower than the first temperature to a place closer to the center in the radial direction as compared to the supplying location of the first gas using the second gas supply port.

In the substrate processing method, the first gas is heated by a heater provided in a cover plate that covers the upper side of the substrate, and is supplied to the substrate, and switching supplying and supply-stopping of the second gas is performed using a switching unit provided in a second gas supply port.

In the above-described substrate processing method, the supplying of the first gas and the second gas is performed in a state where the upper side of the substrate is covered by a cover plate, the second gas is supplied from a pressurized gas source, and the pressure of the second gas is higher than the pressure of the first gas.

In the above-described substrate processing method, switching of supplying and supply-stopping of the first gas is performed using a switching unit provided in a first gas supply port, and the switching of supplying and supply-stopping of the second gas is performed using a switching unit provided in a second gas supply port.

In the substrate processing method, the first gas is supplied from a first gas ejection port provided in a cover member that covers the peripheral portion of the upper surface of the substrate, and the second gas is supplied to a central portion of the substrate at an inner side in the radial direction compared to the peripheral portion, the central portion of the substrate being exposed without being covered by the cover member. Further, the first gas and the second gas are supplied to the bottom of the substrate.

According to the present disclosure, by appropriately switching supplying of the first gas and the second gas of different temperatures, it is possible to rapidly increase or decrease the temperature of the peripheral portion of the substrate.

Hereinafter, the exemplary embodiments of the present disclosure will be described with reference to drawings.

Figure 1:
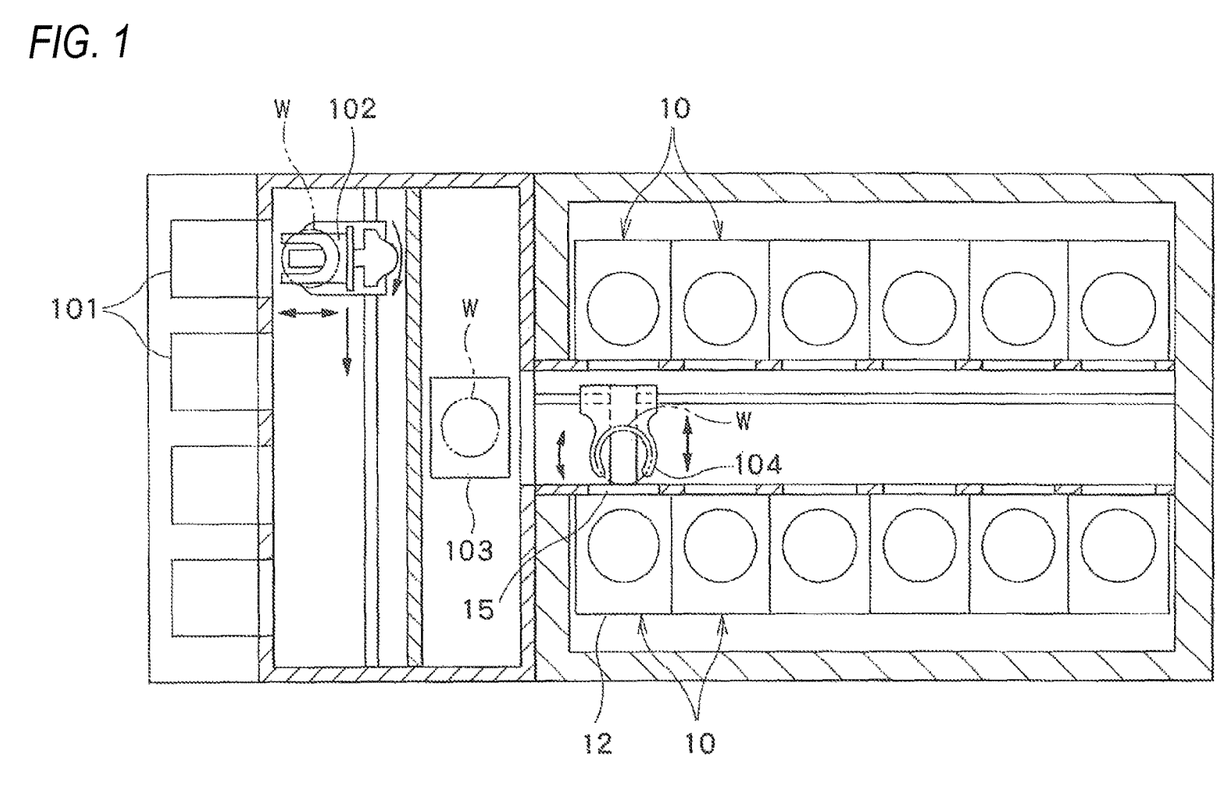
FIG. 1 is a schematic plan view illustrating the entire configuration of a substrate processing system including a peripheral film removing apparatus according to a first exemplary embodiment of the substrate processing apparatus of the present disclosure.

First, the first exemplary embodiment of the substrate processing apparatus according to the present disclosure will be described with respect to a substrate processing system including a peripheral film removing apparatus 10 that is called a bevel wet etching apparatus. As illustrated in FIG. 1, the substrate processing system includes: placing stands 101 on which a carrier is placed which receives a substrate W to be processed such as a semiconductor wafer (hereinafter, also referred to as a "wafer W") from the outside, a transportation arm 102 configured to take out wafer W accommodated in the carrier, a rack unit 103 configured to place wafer W taken out by transportation arm 102, and a transportation arm 104 configured to receive wafer W placed on rack unit 103 and transport wafer W to the inside of peripheral film removing unit 10. As illustrated in FIG. 1, the substrate processing system is provided with a plurality (twelve in the drawing) of peripheral film removal apparatuses 10.

Figure 2:
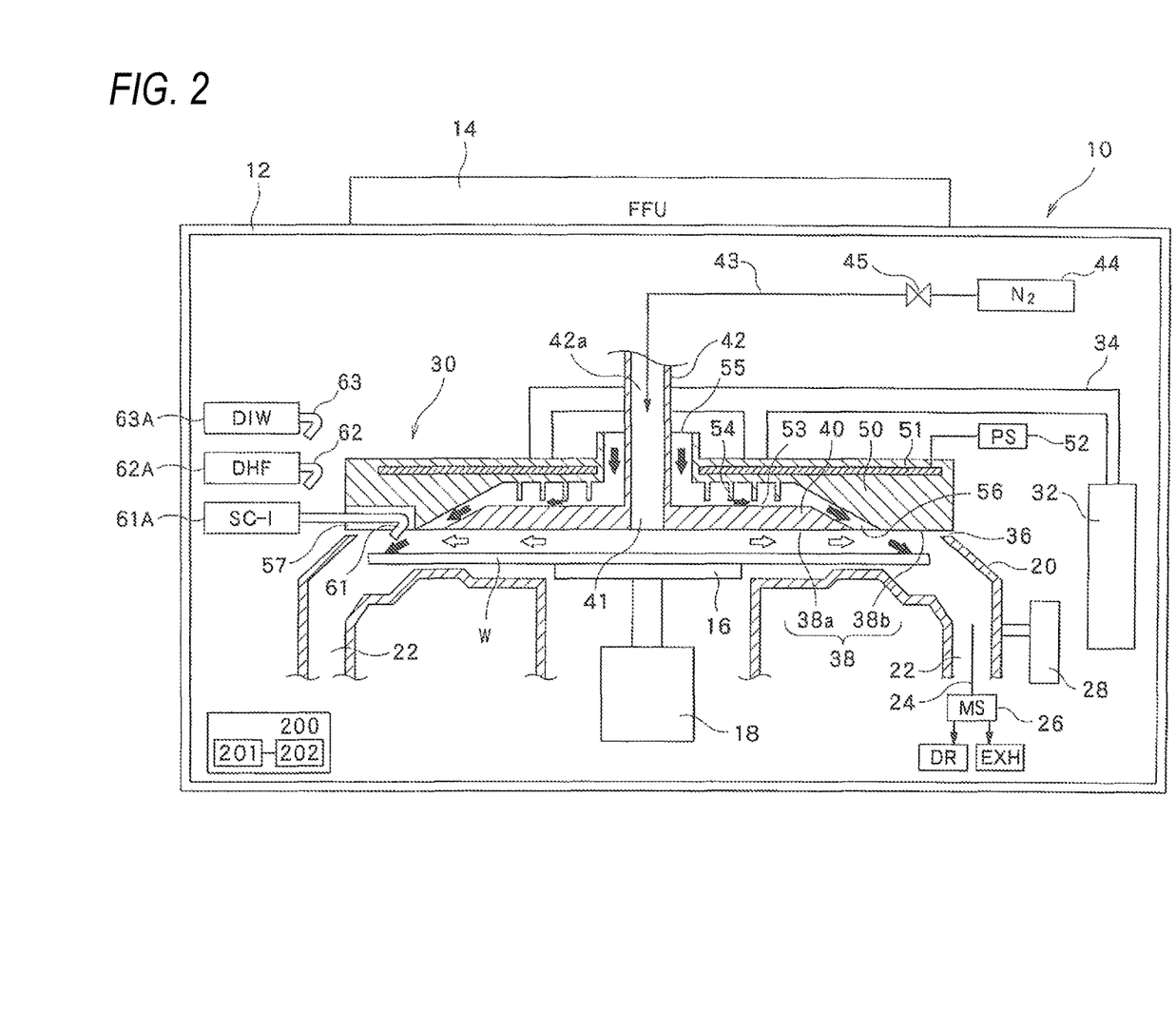
FIG. 2 is a longitudinal cross-sectional view illustrating the configuration of the peripheral film removing apparatus according to the first exemplary embodiment.

Next, the configuration of peripheral film removing apparatus 10 will be described. As illustrated in FIG. 2, peripheral film removing apparatus 10 includes a casing 12. In the ceiling of casing 12, a fan filter unit (FFU) 14 is provided to form a downflow of clean air in a space surrounded by casing 12. In a sidewall of casing 12 (a sidewall in relation to the front side facing the paper in FIG. 2), an opening 15 (see FIG. 1; not illustrated in FIG. 2) is formed to carry-in/out wafer W to/from casing 12, and the opening is opened or closed by a shutter (not illustrated).

In casing 12, a substrate holding unit 16 is provided to hold wafer W in a horizontal posture. Substrate holding unit 16 is configured as a so-called vacuum chuck that holds wafer W by vacuum-adsorbing the central portion of the rear surface (bottom surface) of wafer W. In the lower side of substrate holding unit 16, there is provided a rotation driving unit 18, specifically a rotary motor, configured to rotate wafer W held on substrate holding unit 16 by rotationally driving substrate holding unit 16.

In the outer side in the radial direction of wafer W held by substrate holding unit 16, a generally cylindrical cup 20 is provided to surround wafer W. Cup 20 receives a processing liquid scattered from wafer W by centrifugal force, thereby suppressing the processing liquid from being scattered to the outer side in the radial direction. An ejection port 22 is provided in the bottom of cup 20, a discharge pipeline 24 is connected to discharge port 22, and liquid and gas in cup 20 are discharged through this discharge pipeline 24. A gas-liquid separator (mist separator) 26 is interposed in discharge pipeline 24 such that the liquid and gas discharged from cup 20 are separated from each other and discharged to an exhaust unit EXH and a drain unit DR, respectively. In addition, a structure that separates liquid and gas is provided in the inside of cup 20, and a drain port configured to discharge liquid and an exhaust port configured to discharge gas may be provided separately in the bottom of cup 20. Such a structure is well-known in the related art, and the detailed description is omitted. In any cases, the inner space of cup 20 is sucked under a negative pressure of exhaust port EXH during the operation of the peripheral film removing apparatus 10.

Cup 20 can be elevated by a cup elevation mechanism 28 as schematically illustrated in FIG. 2. When cup 20 is in an "ascent position" as illustrated in FIG. 2, wafer W is located in a lower side than an upper open end of cup 20. Therefore, cup 20 surrounds the peripheral portion of wafer W. When cup 20 descends from the state in FIG. 2 to a "descent position (not illustrated)", wafer W is located above the upper open end of cup 20, and thus, wafer W can be transferred between a transportation arm 104 entering casing 12, and substrate holding unit 16, without being disturbed by cup 20. Instead of cup 20, substrate holding unit 16 may be configured to be elevatable. In this case, by allowing substrate holding unit 16 to ascend from the location as illustrated in FIG. 2, wafer W can be transferred between transportation arm 104 and substrate holding unit 16, without being disturbed by cup 20. In order to realize such a function, substrate holding unit elevation mechanism (not illustrated) may be installed on rotation driving unit 18.

As illustrated in FIG. 2, a cover plate 30 is provided to cover the entire upper surface of wafer W held by substrate holding unit 16. Cover plate 30 is provided to suppress a processing liquid from infiltrating into a device forming region in the central portion of wafer W by forming air currents flowing towards the outer side of wafer in a gap between the peripheral portion of wafer W and cover plate 30. Further, cover plate 30 suppress mists of the processing liquid from being scattered from wafer W, in particular, to the upper direction. Cover plate 30 may ascend or descend via an arm 34 by a cover plate elevation mechanism 32 including an air cylinder and the like. Cover plate 30 is in the descent position (a "processing position" that comes close to and covers wafer W) as illustrated in FIG. 2 when processing the substrate. At this time, cover plate 30 blocks the upper open end of cup 20. Specifically, the peripheral portion of the bottom surface of cover plate 30 and the upper end of cup 20 in the ascent position come into contact with each other or come close with a slight gap at a portion 36 to suppress a processing liquid or mists thereof from leaking out from portion 36. In order to make wafer W transferrable between transportation arm 104 and substrate holding unit 16, cover plate 30 is disposed in the ascent position (a "retreat position" spaced away from the "processing position"). In addition to cover plate elevation mechanism 32, cover plate circling mechanism (not illustrated) may be provided to move cover plate 30 in a horizontal direction between "processing position" and "retreat position".

Cover plate 30 has a bottom surface 38 opposite to (facing) the upper surface (front surface) of wafer W held by substrate holding unit 16. Bottom surface 38 includes a central region 38a opposite to the central portion of wafer W and a peripheral region 38b opposite to the peripheral portion of wafer W. Cover plate 30 includes a lower central member 40 to provide central region 38a of bottom surface 38 and an upper peripheral member 50 to provide peripheral region 38b of bottom surface 38. Lower central member 40 and upper peripheral member 50 are integrally coupled, or integrally configured. However, the illustration of the connecting portion of both members is omitted.

In a part of the peripheral portion of cover plate 30, particularly, in a part of the peripheral portion of upper peripheral member 50, a cut-out portion 57 is provided to allow a nozzle, which supplies a processing liquid to the peripheral portion of wafer W, to enter a space of the upper side of the peripheral portion of wafer W. Cut-out portion 57 is, for example, a concave portion of a rectangular shape formed on the bottom surface of upper peripheral member 50.

Peripheral film removing apparatus 10 includes a first chemical liquid nozzle 61 configured to eject an SC-1 liquid as a first chemical liquid, a second chemical liquid nozzle 62 configured to eject a dilute hydrofluoric acid (DHF) liquid as a second chemical liquid, and a rinse liquid nozzle 63 configured to eject a deionized water (DIW) as a rinse liquid. Each ejection port of nozzles 61, 62 and 63 is formed so as to eject a liquid inclined downwardly towards the outer side of the wafer in order to suppress a liquid spattering towards the device forming region in the central portion of wafer W. First chemical liquid nozzle 61 is associated with a first chemical liquid nozzle moving mechanism (not illustrated in detail) configured to allow a front end portion in the vicinity of the ejection port of first chemical liquid nozzle 61 to enter into cut-out portion 57 or retreat from cut-out portion 57, a first chemical liquid source (not illustrated in detail) configured to supply a first chemical liquid to first chemical liquid nozzle 61, a first chemical supplying pipeline (not illustrated in detail) connected to first chemical liquid nozzle 61 and first chemical liquid source, an opening/closing valve and a flow rate control valve (not illustrated in detail) interposed in first chemical liquid supplying pipeline, and a heater (not illustrated in detail) configured to heat the first chemical liquid. These members are schematically illustrated as a box denoted by a reference numeral 61A. Second chemical liquid nozzle 62 is associated with a second chemical liquid nozzle moving mechanism (not illustrated in detail) configured to allow a front end portion in the vicinity of the ejection port of second chemical liquid nozzle 62 to enter into cut-out portion 57 or retreat from cut-out portion 57, a second chemical liquid source (not illustrated in detail) configured to supply a second chemical liquid to second chemical liquid nozzle 62, a second chemical supplying pipeline (not illustrated in detail) connected to second chemical liquid nozzle 62 and second chemical liquid source, and an opening/closing valve and a flow rate control valve (not illustrated in detail) interposed in second chemical liquid supplying pipeline. These members are schematically illustrated as a box denoted by a reference numeral 62A. Rinse liquid nozzle 63 is associated with a rinse liquid nozzle moving mechanism (not illustrated in detail) configured to allow a front end portion in the vicinity of the ejection port of rinse liquid nozzle 62 to enter into cut-out portion 57 or retreat from cut-out portion 57, a rinse liquid source (not illustrated in detail) configured to supply a rinse liquid to rinse liquid nozzle 62, a rinse supplying pipeline (not illustrated in detail) connected to rinse liquid nozzle 62 and rinse liquid source, and an opening/closing valve and a flow rate control valve (not illustrated in detail) interposed in rinse liquid supplying pipeline. These members are schematically illustrated as a box denoted by a reference numeral 63A. First chemical liquid nozzle 61, second chemical liquid nozzle 62 and rinse liquid nozzle 63 are illustrated as being disposed up and down for the convenience of illustration. However, they are actually at the same height, and disposed in the circumferential or tangential direction of wafer W. Further, cut-out portions 57 only for each of nozzles 61, 62 and 63 may be provided at different locations in the circumferential direction of cover plate 30.

Lower central member 40 is a generally disc-shaped member. At the center of lower central member 40, an opening 41 is formed as an ejection port to eject $N_2$ (nitrogen) gas (second gas) at room temperature. A hollow gas through-flow pipe 42, which extends in an up-down direction, is connected to the center of lower central member 40, and a gas path 42a formed in the inside of gas through-flow pipe 42 is connected to opening 41. A gas supplying pipe 43 is interposed in gas path 42a, and connected to a pressurized gas source 44, which is a source of a pressurized $N_2$ gas at room temperature. In gas supplying pipe 43, an opening/closing valve 45 is interposed as a switching unit to switch supplying and supply-stopping of $N_2$ gas. By opening opening/closing valve 45, the pressurized $N_2$ gas at room temperature is flowed from opening 41 into a space between the upper surface of wafer W and the bottom surface of lower central member 40, and the $N_2$ gas is flowed towards the peripheral portion of wafer W as indicated by white arrows in FIG. 2. Further, the gas (second gas) discharged from opening 41 is not limited to $N_2$ gas, and any other gas that is clean and does not negatively affect wafer W, for example clean air or inert gas may be used.

A heater (heating unit) 51 is embedded in upper peripheral member 50. In this exemplary embodiment, heater 51 includes a resistance heater, and receives power from a power supply 52 to generate heat. The set temperature of heater 51 is, for example, 130° C. to 150° C. Accordingly, upper peripheral member 50 functions as a heating block. A generally disc-shaped gas through-flow space 53 is formed between lower central member 40 and upper peripheral member 50. A plurality of fins 54 protrude from the bottom of upper peripheral member 50 facing gas through-flow space 53. Fins 54 are provided to facilitate heat exchange between gas in gas through-flow space 53 and upper peripheral member 50. Gas through-flow space 53 is provided with an inlet port 55 including an open end opened on the top surface of upper peripheral member 50, that is, the top surface of cover plate 30 in the outer side of gas through-flow pipe 42. Further, in FIG. 2, inlet port 55 is disposed slightly above the top surface of upper peripheral member 50, but may be disposed at the same height as that of the top surface of upper peripheral member 50. However, since the atmosphere in casing 12 is relatively clean at the upper portion close to FFU, it is preferred that inlet port 55 is disposed at the upper side.

When cover plate 30 and cup 20 are in the positional relationship (contact or proximity) as illustrated in FIG. 2, and gas (second gas) pressurized from pressurized gas source 44 is not supplied, the inner space of cup 20 is under a negative pressure because the inner space of cup 20 is always sucked through ejection port 22. Due to this, the atmosphere in the space upper than cover plate 30, particularly, the clean air supplied from fan filter unit 14 is introduced via inlet port 55 into gas through-flow space 53. The introduced clean air (first gas) flows through gas through-flow space 53 towards the outer side approximately in the radial direction as illustrated by black arrows in FIG. 2, and is ejected from an outlet port 56 at the outer side of a central region 38a of bottom surface 38 towards the peripheral portion of wafer W which is a part to be processed. Moreover, the introduced clean air is ejected to the outer side of wafer W. The air current ejected to the outer side of wafer W ensures that a processing liquid is suppressed from infiltrating into a device forming region in the central portion of wafer W by a synergy with the air current ejected to the outer side of wafer W, which is generated between the peripheral portions of cover plate 30 and wafer W by the rotation of wafer W as described above. Further, outlet port 56 may be a single opening that extends continuously in the circumferential direction, or may be a plurality of openings that are disposed intermittently on the circumference. While the gas (the clean air in casing 12 in the present exemplary embodiment) is flowing along with gas through-flow space 53, the temperature is increased (for example, to about 100° C.) by heat exchange with the bottom surface of upper peripheral member 50 and fins 54 heated by heater 51. Thereafter, the gas is ejected from outlet port 56 towards the peripheral portion of wafer W, thereby heating wafer W (for example, about 60° C.). Since outlet port 56 is formed such that the heated gas (first gas) is introduced slantingly downwardly towards the outer side of wafer W with respect to the peripheral portion of wafer W, it is possible to more securely suppress a processing liquid from infiltrating into a device forming region in the central portion of wafer W. Further, since the heated gas is not in parallel to the upper surface of wafer W, but is introduced at an angle with the upper surface of wafer W, the heating efficiency of the peripheral portion of wafer W is enhanced.

In the case where cover plate 30 and cup 20 are in the positional relationship as illustrated in FIG. 2, and gas (second gas) pressurized from pressurized gas source 44 is supplied, a large amount of gas at room temperature flows between the upper surface of wafer W and bottom surface 38 of cover plate 30 towards the outer side (see the white arrows in FIG. 2). Accordingly, after the temperature of the peripheral portion of wafer is increased, the whole wafer as well as the peripheral portion of the wafer is cooled to a temperature suitable for processing with the second chemical liquid supplied at room temperature. At this time, even in the case where the discharge of the heated gas (first gas) from outlet port 56 as illustrated by black arrows in FIG. 2 disappears or decreases greatly under the influence of the pressurized gas (second gas) at room temperature flowing in the vicinity of the peripheral portion of wafer W as illustrated by white arrows in FIG. 2, and furthermore, even if the heated gas is slightly discharged, the peripheral portion of wafer is hardly affected by the heated gas because the flow of the pressurized gas at room temperature covers the peripheral portion of wafer W. The temperature of the peripheral portion of wafer W is changed only by the influence of the pressurized gas at room temperature. That is, if the peripheral portion of wafer W was already heated, the temperature of the peripheral portion of wafer W decreases. Therefore, the switching of heating and cooling of the peripheral portion of wafer W can be performed only by switching supplying and supply-stopping of the pressurized gas from pressurized gas source 44 by opening/closing valve 45. Further, since the gas at room temperature from pressurized gas source 44 is sprayed from opening 41 onto the central portion of wafer W, it is possible to suppress the temperature rise of the portion of wafer W held by a chuck. As a result, it is possible to suppress the failure of the chuck by heat stress of that portion.

As schematically illustrated in FIG. 2, peripheral film removing apparatus 10 includes a controller (control unit) 200 that integrally controls the entire operations thereof. Controller 200 controls operations of all functional parts (for example, substrate holding unit 16, rotation driving unit 18, cup elevation mechanism 28, cover plate elevation mechanism 32, opening/closing valve 45, power supply 52, driving mechanisms of each of nozzles 61, 62 and 63, opening/closing valve, flow rate control valve and the like). Controller 200 may be implemented using, for example, a general purpose computer as a hardware and a program (an apparatus control program and a processing recipe) to operate the computer with a software. The software may be stored in a storage medium such as, for example, a hard disc drive which is fixedly provided in the computer, or in a storage medium such as, for example, a CD-ROM, a DVD, and a flash memory which are removably set in the computer. The storage media are indicated by a reference numeral 201 in FIG. 2. A processor 202 calls and executes a predetermined processing recipe from storage medium 201 based on, for example, instructions from a user interface (not illustrated) as needed. As a result, each functional component of liquid processing apparatus 10 is operated to perform a predetermined processing under the control of controller 200. Controller 200 may be a system controller controlling the whole substrate processing system as illustrated in FIG. 1.

Figure 3A:
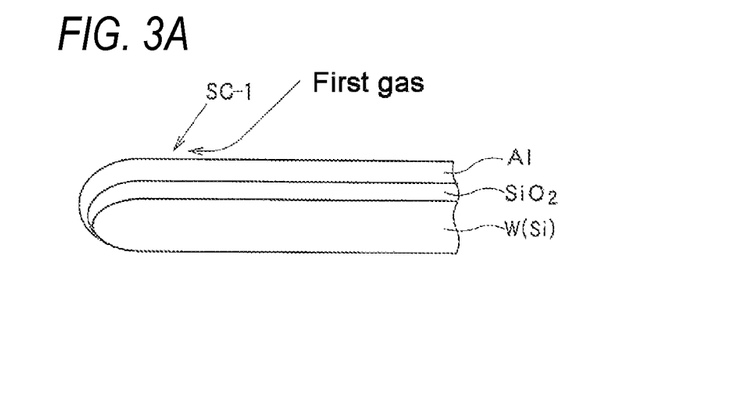
FIG. 3A is a schematic cross-sectional view of a wafer for explanation of a processing performed by the peripheral film removing apparatus.

Next, description will be made with respect to an example of a series of processings performed using peripheral film removing apparatus 10 as described above. A series of cleaning processing steps as described below are performed in such a manner that controller 200 controls each of functional parts of peripheral film removing apparatus 10. Hereinafter, description will be made with respect to a series of processings including completely removing an Al film of a peripheral portion from a laminated structure in which $SiO_2$ film (silicon oxide film) is formed on silicon wafer W and an Al film is formed thereon, as schematically illustrated in FIG. 3, and then, removing the outermost surface of the $SiO_2$ film contaminated with Al (in which Al is diffused).

[Carry-in of Wafer]

First, wafer W is carried-in to peripheral removing apparatus 10. Before carrying-in, cup 20 descends to a descent position, and cover plate 30 ascends to a retreat position. In this state, transportation arm 104, which holds wafer W, enters the inside of casing 12 through opening 15 (illustrated only in FIG. 1) and then places wafer W on substrate holding unit 16. After substrate holding unit 16, which is formed as a vacuum chuck, adsorbs wafer W, transportation arm 104 retreats from the inside of casing 12. Since heater 51 receives the power from power supply 52 before wafer W is carried-in, heater 51 is already heated to about 150° C., and the surface facing the gas through-flow space of upper peripheral member 50 is at a high temperature. Then, as illustrated in FIG. 2, cup 20 ascends to the ascent position, and cover plate 30 descends to the processing position. The positions of cup 20 and cover plate 30 are held until the wafer starts to be carried-out. Since the inner space of cup 20 is always sucked through discharge port 22 as described above, the air introduced from inlet port 55 flows in gas through-flow space 53 as illustrated by black arrows in FIG. 2 while being heated by upper peripheral member 50. The air (first gas) heated to about 100° C. is discharged from outlet port 56, and collides with the peripheral portion of wafer W to heat the peripheral portion of wafer W. At that time, $N_2$ gas at room temperature pressurized from pressurized gas source 44 is not supplied.

[SC-1 Processing]

Figure 3B:
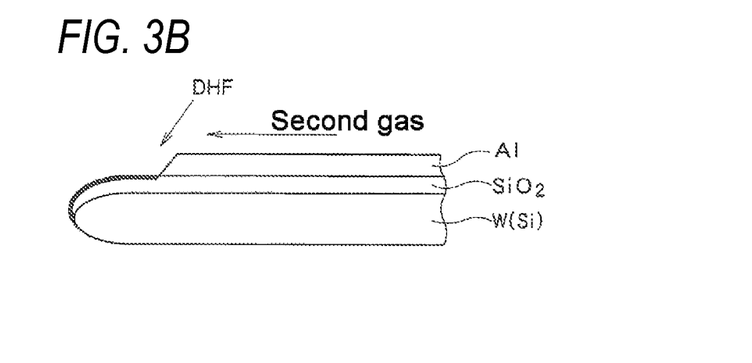
FIG. 3B is a schematic cross-sectional view of a wafer showing that in a peripheral portion, Al film has been etched and removed.

Next, wafer W is rotated by rotation driving unit 18. Then, the portion in the vicinity of the ejection port of first chemical liquid nozzle 61 is allowed to enter into cut-out portion 57 formed on the bottom surface of upper peripheral member 50 to eject SC-1 liquid heated to about 60° C. (a processing liquid at a relatively high temperature) to the peripheral portion of wafer W (see the arrow of SC-1 in FIG. 3A). Accordingly, the Al film in the peripheral portion is etched and removed (see FIG. 3B). At that time, since the peripheral portion of wafer W is heated by hot air, the etching reaction is facilitated. Further, SC-1 liquid is suppressed from infiltrating into the central portion of wafer W by the air flow towards the outer side of wafer W. At that time, $N_2$ gas at room temperature pressurized from pressurized gas source 44 is not supplied.

[DIW Rinse Processing (First Time)]

Next, first chemical liquid nozzle 61 is allowed to retreat from cut-out portion 57, and rinse liquid nozzle 63 is allowed to enter into cut-out portion 57. Further, $N_2$ gas (second gas) at room temperature pressurized from pressurized gas source 44 is supplied to form an air current as illustrated by the white arrows in FIG. 2 in the space between wafer W and cover plate 30. As a result, since the heated air current as illustrated by the black arrows in FIG. 2 disappears or decreases to a negligible extent as described above, the peripheral portion of wafer W is cooled. In addition to the peripheral portion of wafer W, the entirety of wafer W is cooled as well. Subsequently, DIW at room temperature is ejected from rinse liquid nozzle 63 to the peripheral portion of the wafer in a state where wafer W is rotated. Accordingly, the etching residue from the SC-1 processing and the remaining SC-1 liquid are removed from the peripheral portion of wafer W. Further, the peripheral portion of wafer W is cooled by DIW at room temperature supplied from rinse liquid nozzle 63. Further, at this moment, the processing liquid (DIW) is suppressed from infiltrating into the central portion of wafer W by the flow of $N_2$ gas (see the white arrows in FIG. 2) directed towards the outer side of wafer W (the same as in the following DHF processing and DIW rinse processing).

[DHF Processing]

Next, rinse liquid nozzle 63 is allowed to retreat from cut-out portion 57, and second chemical liquid nozzle 62 is allowed to enter cut-out portion 57. Subsequently, DHF at room temperature (a processing liquid at a relatively low temperature) is ejected from second chemical liquid nozzle 62 to the peripheral portion of wafer W in a state where wafer W is rotated while $N_2$ gas at room temperature pressurized from pressurized gas source 44 is being supplied. As a result, the outermost surface layer of the SiO2 film contaminated with Al (the part represented by the thick solid line in FIG. 3B) is removed. Further, if the DHF processing is performed in a state where wafer W is at a high temperature, there is a possibility to cause a problem such as, for example, overetching. However, in the present exemplary embodiment, the DHF processing is performed in a state where $N_2$ gas at room temperature is sprayed to the peripheral portion of wafer W, and thus, there is no concern to cause such a problem. Further, since an action for reducing the temperature of wafer W has also been taken in the previous DIW rinse processing, the above-mentioned problem can be more securely suppressed.

[DIW Rinse Processing (Second Time)]

Next, second chemical liquid nozzle 62 is allowed to retreat from cut-out portion 57, and rinse liquid nozzle 63 is allowed to enter cut-out portion 57. Subsequently, DIW at room temperature is ejected from rinse liquid nozzle 63 to the peripheral portion of wafer W in a state where wafer W is rotated while $N_2$ gas at room temperature pressurized from pressurized gas source 44 is being supplied. Accordingly, the etching residue from the DHF processing and the remaining DHF liquid are removed from the peripheral portion of wafer W.

[Spin Drying]

Next, rinse liquid nozzle 63 is allowed to retreat from cut-out portion 57. Subsequently, the pressurized $N_2$ gas at room temperature is supplied from pressurized gas source 44, and the rotation speed of wafer W is increased. As a result, the peripheral portion of wafer W is spin dried. At this time, drying is facilitated by the flow of $N_2$ gas at room temperature as illustrated by the white arrows in FIG. 2. In order to further enhance the drying efficiency, the first gas (heated gas) may be ejected from outlet port 56 to the peripheral portion of wafer W by stopping supplying the pressurized $N_2$ gas at room temperature from pressurized gas source 44.

[Carry-out of Wafer]

When spin drying is terminated, the rotation of wafer W is then stopped, and supplying the pressurized $N_2$ gas from pressurized gas source 44 is stopped. Subsequently, as cup 20 descends to the descent position, cover plate 30 ascends to the retreat position. Transportation arm 104 enters casing 12 through opening 15 (illustrated only in FIG. 1) to remove wafer W from substrate holding unit 16, and then retreats from casing 12. Therefore, a series of processings for the wafer are terminated.

According to the above exemplary embodiment, the following advantageous effects may be obtained.

According to the above exemplary embodiment, since the heated gas (the first gas) and the gas at room temperature (the second gas at a temperature lower than that of the first gas) are allowed to flow to the peripheral portion of wafer (substrate) W, the temperature of wafer W can be rapidly increased or decreased. Therefore, it is possible to rapidly control the temperature of the peripheral portion of wafer W to an optimal temperature depending on processing.

Further, in the above exemplary embodiment, since a unit (first gas supply port) configured to supply a gas at a high temperature (first gas) forms a gas flow using a negative pressure in cup 20, a pressurized gas source only for forming a gas flow or a power supply is not required. And, a unit (second gas supply port) configured to supply a gas at a low temperature (second gas) uses pressurized gas source 44 exclusively. In addition, as described above, supplying the pressurized gas by pressurized gas source 44 realizes a state equivalent to stopping supplying a gas at a relatively high temperature to wafer W by the first gas supply port. Briefly, the flow of the first gas at a higher temperature is controlled by controlling the flow of the second gas at a lower temperature. Therefore, any electrical or mechanical units are not required to control (particularly, ON/OFF) the flow of the first gas. Accordingly, the apparatus can be constructed at a low price.

The above exemplary embodiment can be modified as follows.

Figure 4:
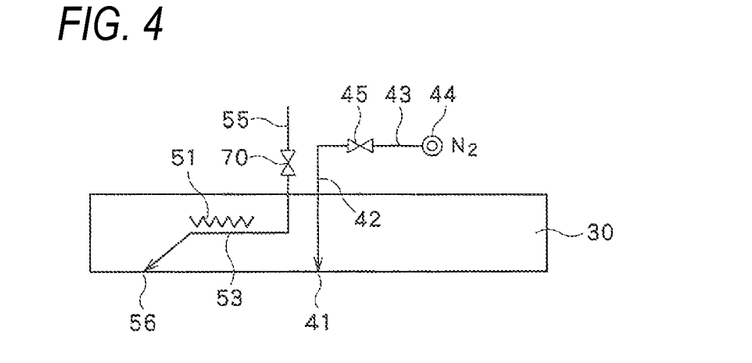
FIG. 4 is a schematic view illustrating another exemplary embodiment of a cover plate, a first gas supply port and a second gas supply port.

For example, as schematically illustrated in FIG. 4, an opening/closing valve 70 may be provided as a switching unit configured to switch supplying and supply-stopping of the first gas, on a path for supplying the first gas (gas at a high temperature). According to this configuration, when supplying the second gas at a low temperature, the first gas at a high temperature is completely suppressed from being introduced into a space in the vicinity of the peripheral portion of wafer W. Therefore, the temperature of wafer W decreases more rapidly. This configuration is particularly advantageous when the temperature difference between the first processing liquid (first chemical liquid) and the second processing liquid (second chemical liquid) is large (for example, when the temperature of the first processing temperature is 100° C. or higher and the temperature of the second processing liquid is room temperature). In this case, the configuration of other parts of peripheral film removing apparatus 10 may adopt the configuration of the exemplary embodiment as illustrated in FIG. 2. Instead of opening/closing valve 70, an opening/closing mechanism configured to open or close inlet port 55 may be provided.

Figure 5:
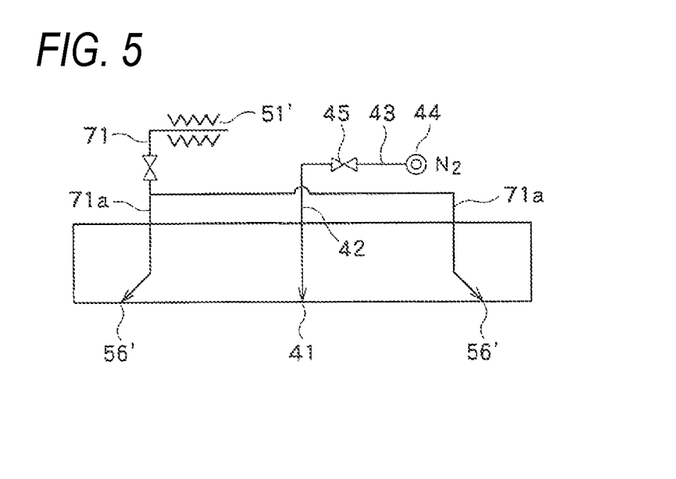
FIG. 5 is a schematic view illustrating still another exemplary embodiment of a cover plate, a first gas supply port and a second gas supply port.

In addition, by further modifying the modified exemplary embodiment as illustrated in FIG. 4, instead of heater 50 provided in cover plate 30, a heater 51' may be provided in the outside of cover plate 30 as illustrated in FIG. 5. In this case, since a space for heat exchange is not necessarily provided in cover plate 30, the configuration of cover plate 30 is simplified. Further, in this case, it is preferred that, to the peripheral portion of cover plate 30 is connected a pipeline 71 to supply the first gas (high temperature gas) in which heater 51' is interposed so as not to thermally affect the second gas (low temperature gas). Further, in this case, as illustrated in FIG. 5, it is preferred that branch pipelines 71a branched from pipeline 71 are provided to be spaced from each other in the circumferential direction of cover plate 30. Of course, like outlet port 56 as illustrated in FIG. 2, outlet ports 56' in communication with each of branch pipelines 71a are formed to be inclined downwardly towards the outer side of wafer W.

Figure 6:
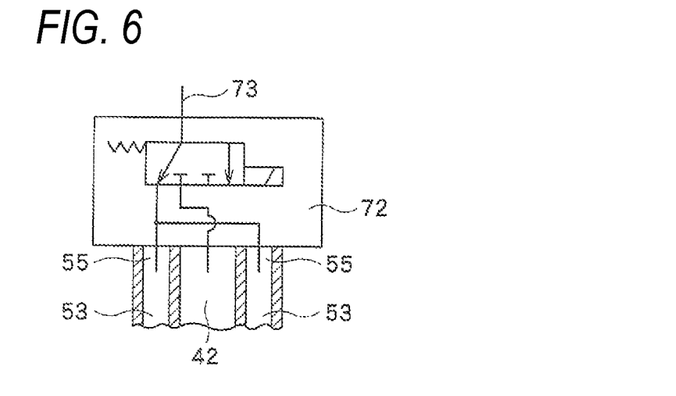
FIG. 6 is a schematic view illustrating yet another exemplary embodiment of a cover plate, a first gas supply port and a second gas supply port, which illustrates a central upper portion of the cover plate.
Figure 7:
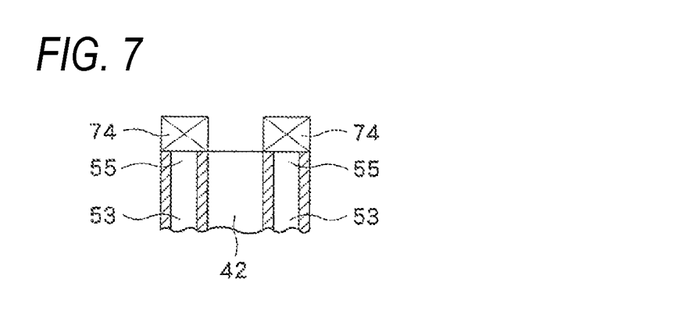
FIG. 7 is a schematic view illustrating still yet another exemplary embodiment of a cover plate, a first gas supply port and a second gas supply port, in which a central upper portion of the cover plate is illustrated.

Further, for example, as schematically illustrated in FIG. 6, the second gas may be set to be originated from clean air supplied from fan filter unit 14 by removing pressurized gas source 44 from a unit configured to supply the second gas (low temperature gas). This configuration is advantageous when the temperature difference between the first processing liquid (first chemical liquid) and the second processing liquid (second chemical liquid) is small (for example, when the temperature of the first processing temperature is about 40° C. and the temperature of the second processing liquid is room temperature) from the viewpoint of reducing equipment cost. This is because a strong cooling power is not required in such a case. In this case, however, since a function that substantially blocks the ejection of the first gas is lost, which is obtained by supplying the pressurized second gas in the exemplary embodiment as illustrated in FIG. 2, a function is preferably provided that allows the first gas at a high temperature and the second gas at a low temperature to alternatively flow. Accordingly, as illustrated in FIG. 6, a switching mechanism 72 is provided, which alternatively switches the inflow of clean air to gas through-flow pipe 42 and gas through-flow space 53. Switching mechanism 72 may be configured with, for example, a three-way conversion valve as illustrated in FIG. 6. In this case, the clean air sucked from a single inlet port 73 passes through switching mechanism 72, and is supplied alternatively to any one of gas through-flow pipe 42 and gas through-flow space 53. Switching mechanism 72 is a unit configured to switch supplying and supply-stopping of the first gas, as well as a unit configured to switch supplying and supply-stopping of the second gas. Switching mechanism 72 may be configured with opening/closing valves provided on pipelines communicating with gas through-flow pipe 42 and gas through-flow space 53, respectively. Further, in a case where wafer W is not required to be heated to a high temperature, the second gas at a low temperature may be allowed to continuously flow. Therefore, an opening/closing mechanism 74 may be provided, which switches only inflow and non-inflow of clean air to gas through-flow space 53, as illustrated in FIG. 7. Further, the modified embodiments of FIGS. 6 and 7 may be constructed on the basis of the exemplary embodiment as illustrated in FIG. 2, by cutting gas through-flow pipe 42 at the height of inlet port 55, and then providing a switching unit such as, for example, switching mechanism 72 or opening/closing mechanism 74 therein. In this case, the configuration of other parts of peripheral film removing apparatus 10 may also adopt the configuration of the exemplary embodiment as illustrated in FIG. 2.

In the above exemplary embodiment, SC-1 is exemplified as a chemical liquid for use at a (relatively) high temperature), and DHF is exemplified as a chemical liquid for use at a (relatively) low temperature (for example, room temperature), but they are not limited thereto. The chemical liquid for use at a high temperature may be SC-2, and the chemical liquid for use at a low temperature may be a buffered hydrofluoric acid (BHF), ammonium hydroxide ($NH_4OH$) or a mixture thereof.

Figure 8:
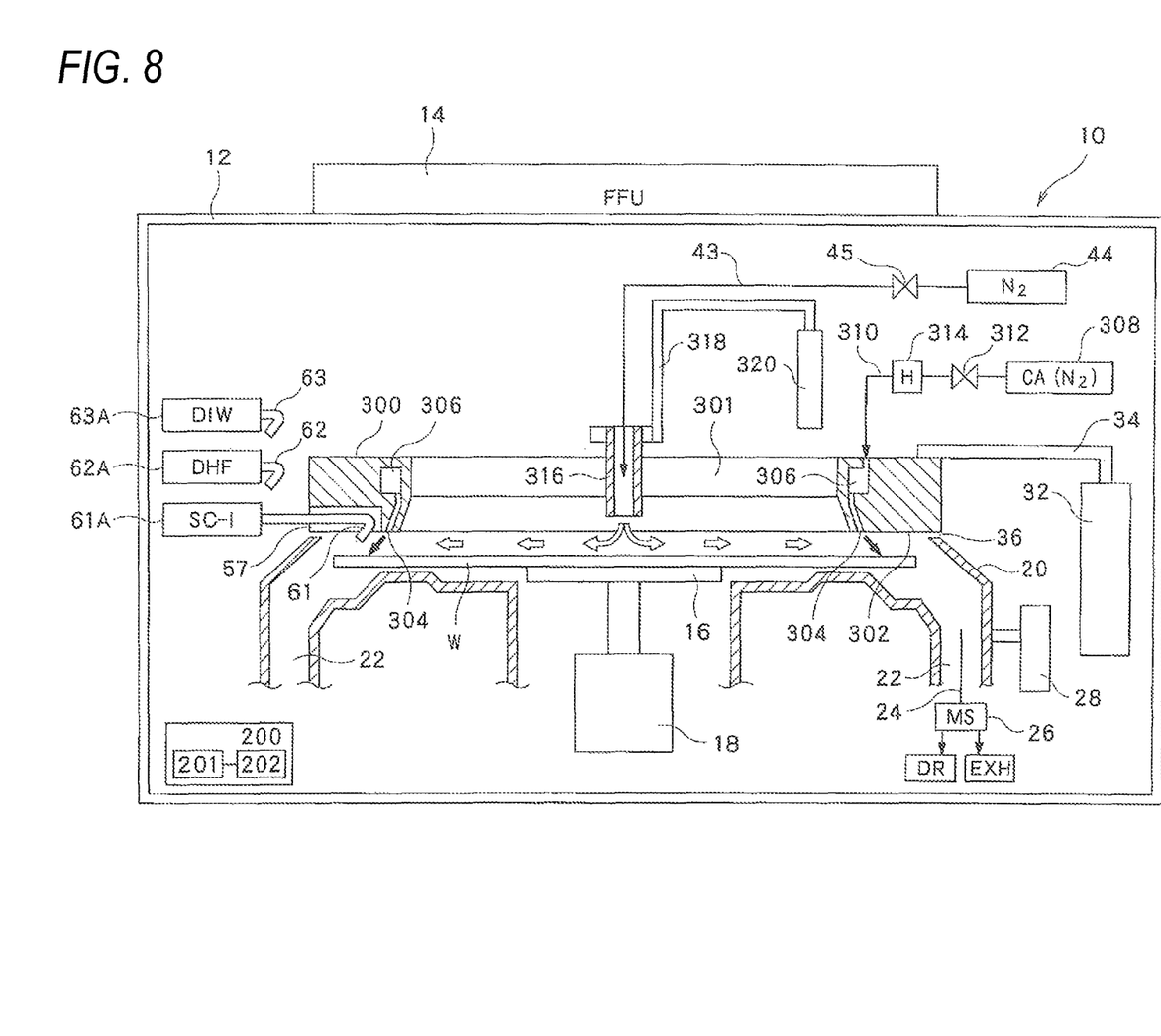
FIG. 8 is a vertical cross-sectional view illustrating a peripheral film removing apparatus according to a second exemplary embodiment of the substrate processing apparatus of the present disclosure.

Next, the second exemplary embodiment of the present disclosure will be described with reference to FIG. 8. In the second exemplary embodiment, instead of cover plate 30 that covers the entire surface of the upper surface of wafer W used in the first exemplary embodiment, a ring shaped cover member 300 is provided, which covers the peripheral portion of the upper surface of wafer W, and does not cover the central portion of the inner side of the upper surface of the wafer to be exposed. A bottom surface 302 of cover member 300 is opposite to the peripheral portion of the upper surface of wafer W held by wafer holding unit 16. In bottom surface 302 of cover member 300, there is formed a first gas ejection port 304 for supplying a heated clean air (preferably, $N_2$ gas), that is, the first gas to the peripheral portion of wafer W. First gas ejection port 304 may be a single opening that extends continuously in the circumferential direction of cover member 300, or may be a plurality of openings that are disposed intermittently on the circumference. A diffusion chamber 306 that extends in the circumferential direction is formed in the inside of cover member 300. A clean air (CA) or $N_2$ gas source 308 is connected via gas supplying pipe 310 to diffusion chamber 306. The pressurized clean air (CA) or $N_2$ gas is supplied from source 308. An opening/closing valve 312 and a heater 314 for heating the gas flowing in gas supplying pipe 310 are interposed in gas supplying pipe 310.

In an opening 301 in the central portion of cover member 300, there is provided a second gas nozzle 316 configured to supply $N_2$ gas, i.e. the second gas, at room temperature towards the central portion of wafer W. Second gas nozzle 316 is connected via an arm 318 to a nozzle moving mechanism 320. By nozzle moving mechanism 320, second gas nozzle 316 may descend to a location in the vicinity of the surface of wafer W when ejecting gas, and retreat to a location spaced away from the surface of wafer W (for example, a location above cover member 300, or above and radially outside of cover member 300) when not ejecting the gas. Further, second gas nozzle 316 may be fixed via an arm to cover member 300 so as to be always located in a predetermined position (for example, a position as illustrated in FIG. 8) in opening 301 in the central portion of cover member 300.

Besides the matters as described above, the configuration of the second exemplary embodiment is the same as the configuration of the first exemplary embodiment. In FIG. 8 which illustrates the second exemplary embodiment, the same members as those of the first exemplary embodiment are indicated by the same reference numerals, and the redundant description will be omitted.

When processing wafer W with a heated chemical liquid (for example, in the SC-1 processing), the supply of the second gas at room temperature from second gas nozzle 316 is not performed, and the heated first gas from first gas ejection port 304 of cover member 300 is ejected to the peripheral portion of wafer W (see the black arrows) to heat the peripheral portion of wafer W. At this moment, a downflow from fan filter unit 14 is introduced via opening 301 in the central portion of cover member 300 through the gap between the upper peripheral portion of wafer W and bottom surface 302 of cover member 300 into cup 20 by a negative pressure in cup 20. If the amount of the heated gas from first gas ejection port 304 is large, the amount of the clean air at room temperature blown from fan filter unit 14 into cup 20 becomes small.

When cooling wafer W from the state (for example, in the DIW processing as described above), the ejection of the heated gas from first gas ejection port 304 is stopped, and the supply of the second gas at room temperature from the ejection port of second gas nozzle 316 is performed, thereby facilitating cooling wafer W. Further, when processing wafer with a chemical liquid at room temperature after cooling wafer W is terminated (for example, in the DHF processing as described above), the ejection of the heated gas from first gas ejection port 304 may be stopped, and the supply of the second gas at room temperature from the ejection port of second gas nozzle 316 may be performed. The second gas ejected from second gas nozzle 316 towards the center of wafer W flows towards the periphery of wafer W and takes heat from wafer W, as illustrated by the white arrows.

Likewise, in the second exemplary embodiment, since the heated gas (first gas) and the gas at room temperature (second gas at a lower temperature than that of the first gas) are allowed to flow to the peripheral portion of wafer (substrate) W, the temperature of wafer W can be rapidly increased or decreased, which has the same advantageous effect as in the first exemplary embodiment that it is possible to rapidly control the temperature of the peripheral portion of wafer W to an optimal temperature depending on processing.

Figure 9A:
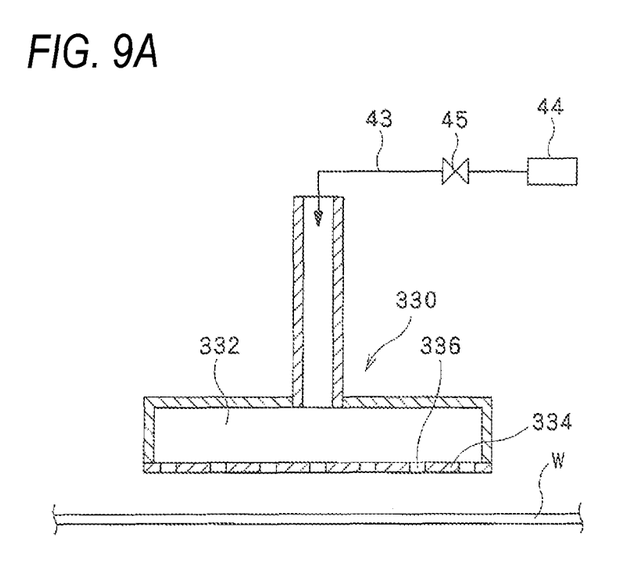
FIG. 9A is a view illustrating a modified embodiment of the first gas supply port of the peripheral film removing apparatus of the second exemplary embodiment.
Figure 9B:
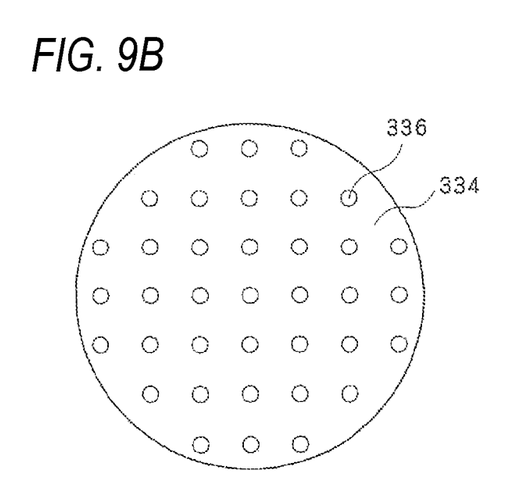
FIG. 9B is a view showing an embodiment of an ejection port formed in an ejection plate.

In the second exemplary embodiment, instead of second gas nozzle 316 having a single ejection port, it is possible to use a gas nozzle having a plurality of outlet ports (ejection ports) as illustrated in FIG. 9. Gas nozzle 330 has a diffusion chamber 332 receiving the gas supplied from gas source 44 as illustrated in FIG. 9A. The bottom wall of diffusion chamber 332 is formed as an ejection plate 334 having a plurality of ejection port 336. Ejection port 336 is disposed in, for example, a lattice (grid) shape as illustrated in FIG. 9B. Accordingly, by disposing ejection plate 334 having a relatively large area above wafer to supply $N_2$ gas to wafer W, it is possible to reduce the amount of the clean air in a high oxygen concentration (flowed down from fan filter unit 14) that reaches the surface of wafer W. Therefore, the low humidity and low oxygen concentration required processing (for example, the spin drying processing as described above) can be performed efficiently.

Figure 10:
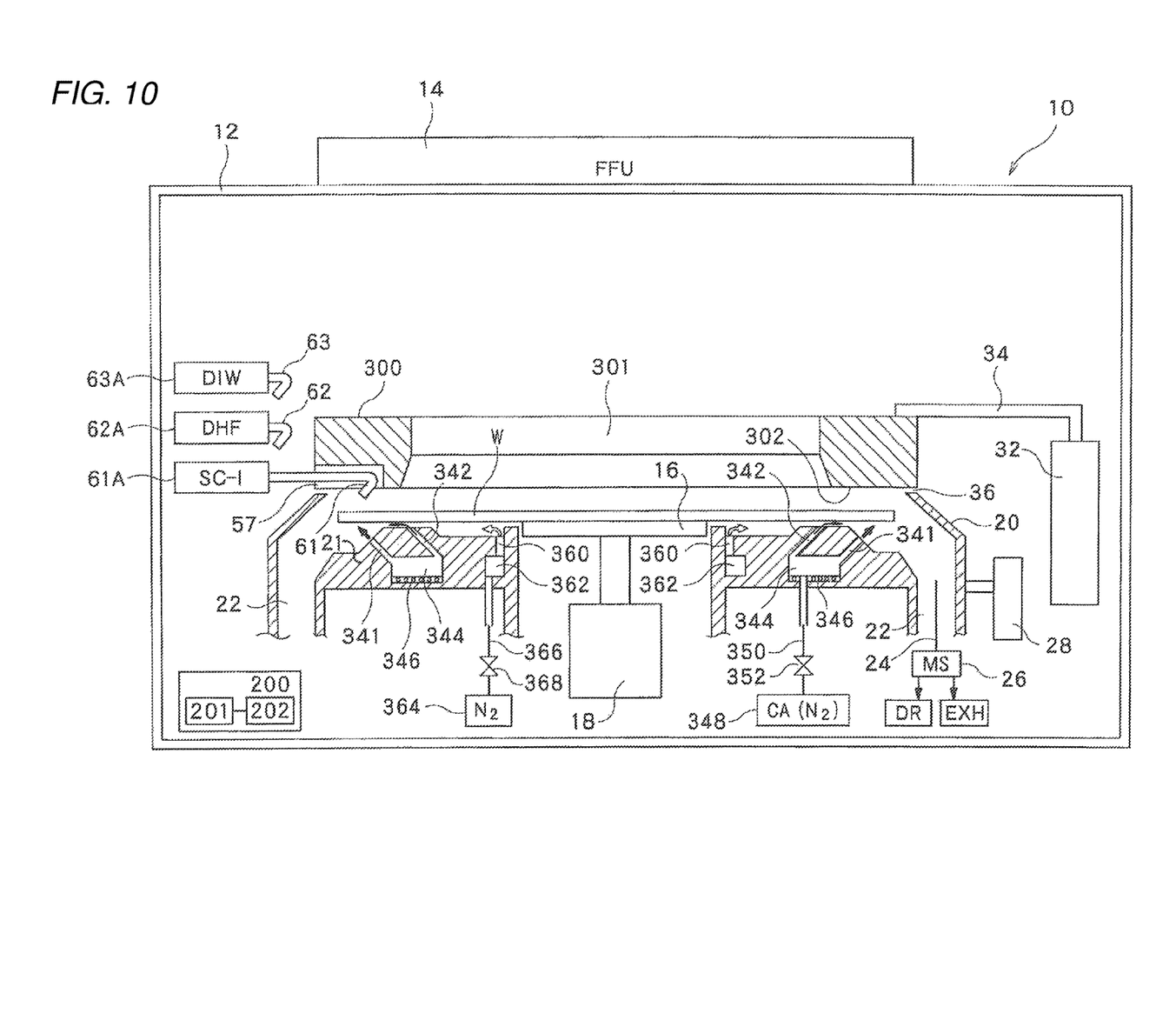
FIG. 10 is a vertical cross-sectional view illustrating a peripheral film removing apparatus according to a third exemplary embodiment of the substrate processing apparatus of the present disclosure.

Next, the third exemplary embodiment of the present disclosure will be described with reference to FIG. 10. The third exemplary embodiment is different from the second exemplary embodiment in that the heating and cooling of wafer W are performed by supplying a gas to the bottom surface of wafer W instead of by supplying a gas to the upper surface of wafer W in the second exemplary embodiment. In the third exemplary embodiment, there is provided a configuration in which a gas is supplies to the bottom surface of wafer W in the inner side of cup 20 (a portion located in the lower side of wafer W). In the inner portion 21 of cup 20, there are formed an outer side first gas ejection port 341 configured to eject the heated first gas (clean air or $N_2$ gas) to the peripheral portion of the bottom surface of wafer W held by substrate holding unit 16, and an inner side first gas ejection port 342 disposed in the inner side in the radial direction of outer side first gas ejection port 341. Outer and inner first gas ejection ports 341 and 342 may be a single opening that extends continuously in the circumferential direction of cup 20, or may be a plurality of openings that are disposed intermittently on the circumference.

When heating the peripheral portion of the wafer, the pressurized clean air or N.sub.2 gas at room temperature is supplied from a gas source 348 through a pipeline 350, in which an opening/closing valve 352 is interposed, into a gas diffusion space (gas diffusion chamber) 344 provided in the inner portion 21 of cup 20. A heater 346 is provided in the vicinity of gas diffusion space 344. The gas supplied to gas diffusion space 344 is diffused circumferentially in gas diffusion space 344 while heating, and is ejected as a heated first gas from outer and inner first gas ejection ports 341 and 342 towards the peripheral portion in the bottom surface of wafer W to heat the peripheral portion of wafer W. Like heater 346, a heater (not illustrated) may be provided in a location in the vicinity of diffusion chamber 306 in cover member 300 to heat the gas in diffusion chamber 306.

In a further radially inner side of first gas ejection port 342, there is formed a second gas ejection port 360 configured to eject $N_2$ gas at room temperature, i.e. a second gas to the central portion of the bottom surface of wafer W. Second gas ejection port 360 may be a single opening that extends continuously in the circumferential direction of cup 20, or may be a plurality of openings that are disposed intermittently on the circumference.

When cooling wafer W (or when processing wafer W at room temperature), $N_2$ gas, which is a pressurized clean air at room temperature, is supplied from a gas source 364 through a pipeline 366, in which an opening/closing valve 368 is interposed, into a gas diffusion space (gas diffusion chamber) 362 provided in the inner portion 21 of cup 20. The $N_2$ gas is diffused circumferentially in gas diffusion space 362 and ejected from gas ejection port 360 (see the white arrows). The second gas at room temperature flows towards the peripheral portion of wafer W, and at this time, takes heat from wafer W. Second gas ejection port 360 may be provided between outer side first ejection port 341 and inner first gas ejection port 342.

Besides those as described above, the configuration of the third exemplary embodiment is the same as the configuration of the first and second exemplary embodiments. In FIG. 10 which illustrates the third exemplary embodiment, the same members as those of the first and second exemplary embodiments are indicated by the same reference numerals, and the redundant description is omitted. Likewise, in the third exemplary embodiment, the temperature of wafer W can be rapidly increased or decreased, thereby having the same advantageous effect as in the first and second exemplary embodiments that it is possible to rapidly control the temperature of the peripheral portion of wafer W to an optimal temperature depending on processing.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
  a substrate holding unit configured to hold a substrate horizontally;
  a rotation driving unit configured to rotate the substrate holding unit;
  a first processing liquid nozzle configured to supply a first processing liquid to a peripheral portion of the substrate held by the substrate holding unit;
  a first opening/closing valve configured to switch between supplying and not supplying the first processing liquid to the first processing liquid nozzle;
  a second processing liquid nozzle configured to supply a second processing liquid, the temperature of which is lower than that of the first processing liquid, to the peripheral portion of the substrate held by the substrate holding unit;
  a second opening/closing valve configured to switch between supplying and not supplying the second processing liquid to the second processing liquid nozzle;
  a first gas supply port configured to supply a first gas at a first temperature to a first gas supplied place of the substrate held by the substrate holding unit;

a first switching valve configured to switch between supplying and not supplying the first gas to the first gas supply port;

a cup configured to surround the substrate held by the substrate holding unit and receive the processing liquid; and a controller configured to control the first gas supply port and the first switching valve, wherein the first gas supply port including an inner gas ejection port and an outer gas ejection port is disposed in an inner portion of the cup, and each of the inner gas ejection port and the outer gas ejection port is connected to a first gas diffusion space that is provided with a heater adjacent thereto, wherein at least one of the inner gas ejection port and the outer gas ejection port extends continuously along a circumferential direction of the inner portion of the cup or is formed with a plurality of openings along the circumferential direction of the inner portion of the cup, and wherein the controller is programmed to control the first gas supply port and the first switching valve such that the first gas is supplied from a gas supply source to the first gas diffusion space and heated to the first temperature by the heater, and the first gas is then diffused along the circumferential direction of the substrate to be discharged to a circumferential edge of the substrate.

2. The substrate processing apparatus of claim 1, further comprising:

a second gas supply port provided separately from the first gas supply port and configured to supply a second gas at a second temperature lower than the first temperature to a place closer to the center in the radial direction as compared to the first gas supplied place with respect to the substrate held by the substrate holding unit; and a second switching valve configured to switch between supplying and not supplying the second gas to the second gas supply port, wherein the first opening/closing valve, the second opening/closing valve, the first switching valve and the second switching valve such that the second switching valve is closed and the first switching valve is opened to supply the first gas toward the substrate from the first gas supply port while the first processing liquid is being supplied toward the substrate from the first processing liquid nozzle by opening the first opening/closing valve, and the second switching valve is opened to supply the second gas toward the substrate from the second gas supply port while the second processing liquid is being supplied toward the substrate from the second processing liquid nozzle by opening the second opening/closing valve, and wherein the controller is programmed such that the first switching valve is closed while the second processing liquid is being supplied toward the substrate from the second processing liquid nozzle by opening the second opening/closing valve.

3. The substrate processing apparatus of claim 2, wherein the controller is programmed to further control the rotation driving unit such that:

the first processing liquid and the second processing liquid are supplied in a state where the substrate is being rotated by the rotation driving unit, after the supplying the first processing liquid and the second processing liquid has been completed, in a state where the substrate is being rotated by the rotation driving unit, the second gas is supplied toward the substrate from the second gas supply port by opening the second switching valve and closing the first opening/closing valve, the second opening/closing valve and the first switching valve, and then, the rotation of the substrate by the rotation driving unit is stopped and the supplying of the second gas toward the substrate from the second gas supply port is stopped by closing the second switching valve.

4. The substrate processing apparatus of claim 2, wherein the first processing liquid nozzle and the second processing liquid nozzle are provided above the substrate holding unit, and the first gas supply port and the second gas supply port are provided below the substrate held by the substrate holding unit.

5. The substrate processing apparatus of claim 4, wherein the substrate holding unit holds the substrate by vacuum-adsorbing a center portion of the lower surface of the substrate.

6. The substrate processing apparatus of claim 4, wherein a ring-shaped cover member with an opening in the center thereof is provided to cover the peripheral portion of the upper surface of the substrate held by the substrate holding unit.

7. The substrate processing apparatus of claim 6, wherein a fan filter unit configured to supply clean air is provided at a place above the cover member, and the clean air is supplied to the upper surface of the substrate held by the substrate holding unit through the opening of the cover member.

8. The substrate processing apparatus of claim 1, wherein a heater is provided at a place of the cup which is below the substrate holding unit.

9. The substrate processing apparatus of claim 8, wherein the first gas heated by the heater is supplied from the first gas supply port.

10. The substrate processing apparatus of claim 1, wherein at least one of the inner gas ejection port and the outer gas ejection port is inclined upwardly from a central side of the inner portion of the cup toward a peripheral side of the inner portion of the cup such that the first gas is discharged from the central side of the substrate to the circumferential edge of the substrate in an upwardly inclined direction.

* * * * *